US006665843B2

(12) United States Patent
Frech et al.

(10) Patent No.: US 6,665,843 B2
(45) Date of Patent: Dec. 16, 2003

(54) METHOD AND SYSTEM FOR QUANTIFYING THE INTEGRITY OF AN ON-CHIP POWER SUPPLY NETWORK

(75) Inventors: Roland Frech, Ostfildern (DE); Andreas Huber, Holzgerlingen (DE); Erich Klink, Schoenaich (DE); Jochen Supper, Nufringen (DE)

(73) Assignee: International Business Machines Corporation, Armonk, NY (US)

( * ) Notice: Subject to any disclaimer, the term of this patent is extended or adjusted under 35 U.S.C. 154(b) by 119 days.

(21) Appl. No.: 10/053,197

(22) Filed: Jan. 18, 2002

(65) Prior Publication Data

US 2002/0125897 A1 Sep. 12, 2002

(30) Foreign Application Priority Data

Jan. 20, 2001 (EP) .......................... 011 01 309

(51) Int. Cl.[7] .................. G06F 17/50; G05F 1/10
(52) U.S. Cl. ................. 716/4; 716/1; 327/541; 327/540
(58) Field of Search ............... 716/4, 1–3; 327/541, 327/540

(56) References Cited

U.S. PATENT DOCUMENTS

| 5,504,452 A | * | 4/1996 | Takenaka ............... 327/541 |
| 5,856,756 A | * | 1/1999 | Sasahara et al. .......... 327/540 |
| 5,926,394 A | * | 7/1999 | Nguyen et al. ............ 716/1 |
| 6,184,744 B1 | * | 2/2001 | Morishita ............... 327/541 |
| 6,310,511 B1 | * | 10/2001 | Weinfurtner ............. 327/540 |
| RE37,552 E | * | 2/2002 | Svensson et al. .......... 363/60 |
| 6,392,472 B1 | * | 5/2002 | Kobayashi et al. ........ 327/541 |
| 6,477,694 B1 | * | 11/2002 | Irino et al. .............. 716/15 |
| 2002/0030538 A1 | * | 3/2002 | Morishita ............... 327/541 |

* cited by examiner

Primary Examiner—Vuthe Siek
Assistant Examiner—Magid Y Dimyan
(74) Attorney, Agent, or Firm—H. Daniel Schnurmann

(57) ABSTRACT

A method and system for analyzing the dynamic behavior of an electrical circuit to determine whether a voltage level provided by a power supply network drops below a predetermined voltage level during operation of the electrical circuit is described. In a first step, a design data set representing pertinent technical specifications of an electrical or an integrated circuit are read in order to extract location information and value of switching and non-switching capacitance. Next, the circuit and technology propagation speeds are inputted therein. The length for specifying the size of a portion of a circuit area is determined wherein the electrical circuit is formed. Next, the circuit area is divided into a plurality of partitions of a specified size, and the switching capacitance and the non-switching capacitance are separately summarized for each partition. The voltage level drop is then calculated for each partition. Finally, the calculated voltage level drop is displayed in relation to the respective partition. The present method and system can be advantageously used for an on-chip power supply network evaluation as well as for an early chip development process.

14 Claims, 3 Drawing Sheets

METHOD AND SYSTEM FOR QUANTIFYING THE INTEGRITY OF AN ON-CHIP POWER SUPPLY NETWORK

FIELD OF THE INVENTION

The present invention generally relates to the field of design automation and computer-aided design (CAD) of integrated circuits, and more particularly, to a method and system for analyzing the dynamic behavior of an electrical circuit to determine whether a voltage level provided by the power supply network drops below a predetermined voltage level when a predetermined number of electrical elements switch simultaneously.

DESCRIPTION OF RELATED ART

Today CMOS (Complementary Metal Oxide Semiconductor) circuit technology and its application to synchronous switching digital VLSI (Very Large Scale Integration) that operates at high frequencies and which shows significant current fluctuations imposes serious constraints on the associated power supplies. The reason lies in the semiconductor fabrication. CMOS circuit technology which uses a combination of n and p-doped semiconductors to achieve low power dissipation. Any path through a gate where current flows includes both kinds of transistors (i.e., n and p-type). Since only one type turns on to a stable state, there is hardly any static power dissipation. However, current flows when the gate switches, which normally occurs when charging the parasitic capacitances.

Current fluctuations typically generate noise voltages, i.e., unintentional variations of the voltage level. Because of such fluctuations, the supply voltage level is prone to drop even below a predetermined voltage level necessary for the faultless operation of the circuits comprising the chip or module, which jeopardizes the operation of the entire system. Therefore, one of the major challenges in modern circuit design is to design a reliable power supply system, i.e., one that provides a voltage supply level that stays within a predefined range even under worst case conditions. Thus, the power supply is required to display a minimum amount of noise even when all the gates forming the logic or memory switch simultaneously.

A conventional approach is to built a power supply network which maintains the lowest possible impedance, from DC level up to its highest operational frequency. In such a system, power supply noise is at minimum. To achieve this goal, the designer provides decoupling capacitors, each generating a local capacitance along the power path from the primary power source down to the switching circuits. The closer to the switching circuit high frequency capacitors, i.e., those showing a good high frequency response, the better the provision for high speed current changes. Ultimately, the power supply decoupling capacitors are best distributed at the chip level among the switching circuits. However, tools to simulate the on-chip power distribution are not commonplace today and are very complex. Furthermore, it is hardly possible to use them interactively during chip physical design, because of their complexity.

OBJECTS OF THE INVENTION

Accordingly, it is an object of the present invention to provide a method and a system for analyzing the dynamic behavior of an electrical circuit as part of an integrated circuit to determine whether a voltage level provided by the power supplies drops below a predetermined level during operation of the electrical circuit.

It is another object to provide a method and a system for analyzing the dynamic behavior of the electrical circuit to determine that the voltage level provided by the power supply network drops below the predetermined voltage level when a predetermined number of electrical elements switch simultaneously.

BRIEF SUMMARY OF THE INVENTION

The foregoing and other objects are achieved by a method and a system for analyzing the dynamic behavior of electrical circuits as part of an integrated circuit, wherein each electrical circuit includes a plurality of electrical elements and a power supply system. The power supply system is formed by an external voltage source and by a plurality of electrical connections for providing a predetermined supply voltage level $U_0$ to each electrical element. An analysis determines whether the voltage level at any of the electrical elements drops below a predetermined voltage level when a certain number of electrical elements switch simultaneously. In order to calculate a worst case, it is considered that all electrical elements switch from one state into another at the same time.

In a first step, a design data set that represents the technical specifications of the electrical circuit or the integrated circuit, is read in order to extract the location and the value of the switching and non-switching capacitance $C_s$, $C_0$. Additionally, a circuit and technology specified propagation speed v is provided. In the next step, a length is determined to specify the size of a portion of a circuit area upon which the electrical circuit is formed. Thereafter, the circuit area is divided in a plurality of partitions of a specified size, and the switching capacitance $C_s$ and the non-switching capacitance $C_0$ are separately summarized for each portion. Then, the voltage level drop $\Delta U$ is individually calculated for each partition. Finally, the calculated voltage level drop $\Delta U$ is displayed in relation to the respective partition.

The method of the present invention can be used for on-chip power supply network evaluation. It was found to be sufficiently efficient for early use in the chip development process and the chip physical design phase. Since the method and system measures the power supply integrity, i.e., whether the power supply operation is unimpaired by the circuit operation, it allows optimize the chip layout and power supply decoupling capacitors.

The behavior of a power supply system being a part of an electrical circuit subjected to analysis, as described above, is conditioned by many different electrical values, such as the non-inductive resistance, the capacity reactance and the inductance. However, typically, the power supply networks in question are mainly inductance dominated, i.e., the influence of the inductance on the system behavior is comparably larger so that the other electrical values may even be neglected for the purpose of the analysis, in accordance to the present invention. Every electrical element, being part of the analyzed electrical circuit, provides a certain capacitance. For the analysis, according to the present invention, the capacitance of each electrical element is divided in two different types. The first type is referred to as switching capacitance $C_s$, i.e., a capacitance which has to be charged whenever the respective electrical element changes its state or switches. The second type is a non-switching capacitance $C_0$ which in not effected by changing the state of the electrical element nor by its switching. The non-switching capacitance $C_0$, however, keeps some electrical charge which may be supplied to the power supply network.

Charging the switching capacitance $C_s$ of an electrical element during switching is a major physical effect which needs external power supply support. Due to the high switching speed, the inductance dominated power supply path mainly controls the behavior of the voltage level provided by the power supply network to the switching electrical elements. Because of this, an external power supply cannot instantly provide sufficient electrical charge demanded by an electrical element in order to charge the switching capacitance $C_s$. Instead, the electrical charge needed to charge the switching capacitance $C_s$ is at first taken from the non-switching capacitance $C_0$ being situated very closely in relation to the switching location. Hence, only a fraction of the entire non-switching capacitance $C_0$ is available to provide the electrical charge that is needed for a switching event.

Using the law of charge conservation, the initial voltage collapse or voltage level drop DU of the nominal power supply voltage level $U_0$ can generally be calculated as follows:

$$Q_0 = C_0 \cdot U_0 = (C_0 + C_S) \cdot (U_0 - \Delta U) \rightarrow \Delta U = \frac{C_S}{C_s + C_0} \cdot U_0 \quad (1)$$

In order to use the above formula for analyzing an entire electrical circuit, a suitable value for the non-switching capacitance $C_0$ needs to be determined. Thus, for calculating the expected voltage collapse $\Delta U$ from all non-switching capacitance only such portion is taken into account which shows its effect on the behavior of the voltage level provided to the switching electrical element. To determine whether a particular non-switching capacitance is able to provide an electrical charge to a switching electrical element, the distance from the non-switching capacitance to the switching electrical element and the voltage collapse propagation speed on the (on-chip) power network v needs to be considered.

Alternatively, only a non-switching capacitance within a critical distance D to the switching location can influence (reduce) the voltage collapse. This can be expressed by the reaction time $T_R$ in relation to the transition time $T_S$. The reaction time $T_R$ is the span of time wherein an electrical charge is expected to arrive at a switching location. The transition time $T_S$ is the span of time needed for the switching event to conclude. Under favorable circumstances, an electrical charge should arrive at a switching location at the latest after half the transition time $T_S$ has elapsed. However, other specifications may also be suited for the analysis, according to the present invention, e.g., the electrical charge arriving at the switching location at the latest after a third of the transition time $T_S$ has elapsed.

The critical distance D can be calculated according to the following formula, wherein requirement is considered that the reaction time $T_R$ is less than half the transition time $T_S$. In this time, a burst noise has to travel twice the critical distance D, at the propagation speed v.

$$T_R = 2 \cdot \frac{D}{v} \leq \frac{T_S}{2} \rightarrow D \leq \frac{v \cdot T_S}{4} \quad (2)$$

The values needed to calculate the critical distance D and the initial voltage collapse $\Delta U$ are known from the design of the electrical circuit. The values for the switching and the non-switching capacitance $C_S$ and $C_0$ can be extracted from the chip design data set. The power network propagation speed is known from the technology that includes the electrical circuit and physical designs. The transition time of an electrical element is known from the technology specifications, whereas the reaction time $T_R$ is predetermined according to the considerations stated previously.

The respective system according to the present invention includes means for determining the length for specifying the size of a portion of a circuit area upon which the electrical circuit is formed; means for dividing the circuit area into a plurality of portions of the specified size, means for separately summarizing the switching capacitance $C_s$ and the non-switching capacitance $C_0$ individually for each portion and means for calculating the voltage level drop $\Delta U$ individually for each portion.

The present invention can be realized in hardware, in software, or in a combination of hardware and software. Any computer system—or apparatus adapted for carrying out the methods described herein—is suited for the stated purpose. A typical combination of hardware and software consists of a general purpose computer system with a computer program that, when loaded and executed, controls the computer system such that it carries out the methods described herein. The present invention can also be embedded in a computer program product, which comprises all the features enabling the implementation of the methods described herein, and which—when loaded in a computer system—is able to carry out these methods.

Computer program means or computer program in the present context includes any expression, in any language, code or notation, of a set of instructions intended to cause a system having an information processing capability to perform a particular function either directly or after either or both of the following a) conversion to another language, code or notation; b) reproduction in a different material form.

BRIEF DESCRIPTION OF THE DRAWINGS

The above, as well as additional objectives, aspects and advantages of the invention, will be apparent in the following detailed written description. The novel features of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

DETAILED DESCRIPTION OF THE INVENTION

Figure 1:
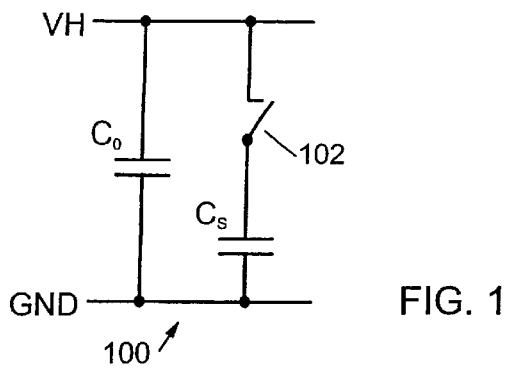
FIG. 1 shows an electrical circuit diagram illustrating the effect of an effective local power supply capacitance $C_0$ and an equivalent local capacitance $C_s$.

With reference to FIG. 1, there is depicted an electrical circuit diagram 100 illustrating the effect of an effective local power supply non-switching capacitance $C_0$ and an equivalent local switching capacitance $C_S$. All physical structures, such as gates, transistors, electrical lines or even capacitors, can be illustrated by using an equivalent circuit diagram, in which for a specific operation range the physical structures are represented by a set of base elements. From such a representation, the values for the non-switching capacitance $C_0$ and the switching capacitance $C_S$ can be extracted. The non-switching capacitance $C_0$ behaves like an ordinary capacitor being directly connected between ground GND and a supply voltage VH.

The switching capacitance $C_S$ behaves like a capacitor being connected in series with a switch 102 between the ground line GND and the supply voltage line VH, as illustrated in FIG. 1. From the actual chip content placement, the distribution of $C_0$ and $C_S$ for a worst case scenario can be extracted.

Figure 2:
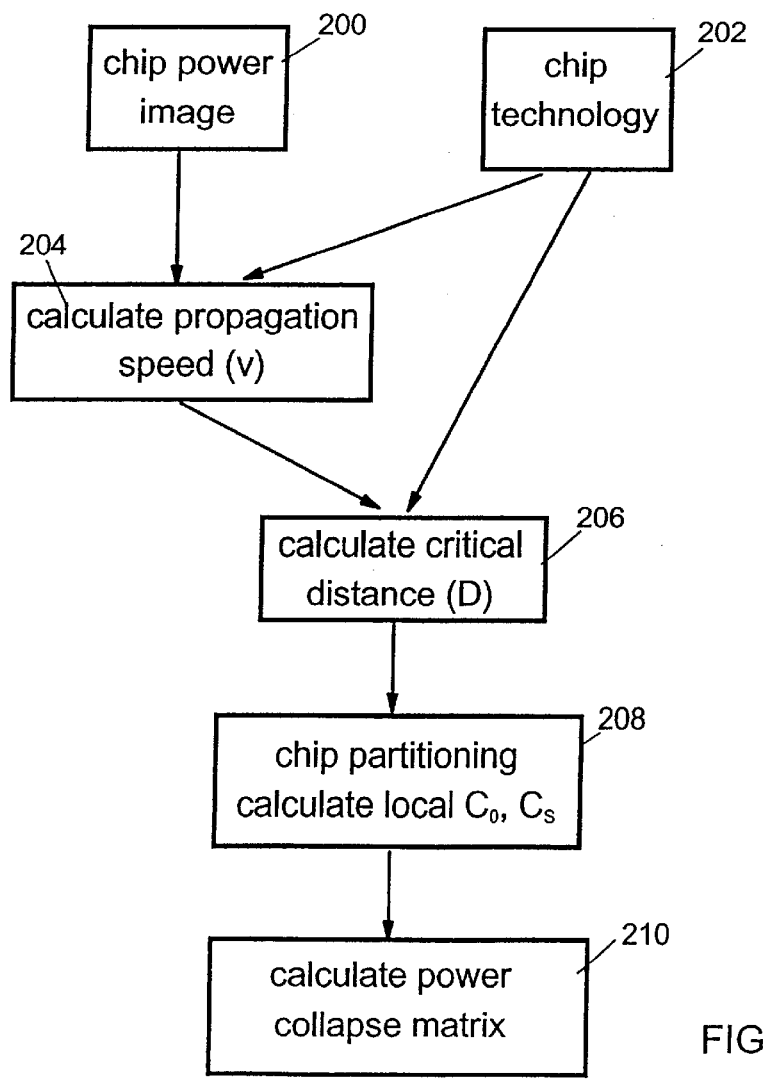
FIG. 2 shows a flow chart illustrating a method for analyzing the dynamic behavior of an electrical circuit to determine whether a voltage level provided by a power supply network drops below a predetermined voltage level during operation of the electrical circuit, according to the present invention.

With reference now to FIG. 2, there is depicted a flow chart illustrating a method for analyzing the dynamic behavior of an electrical circuit to determine whether a voltage level provided by a power supply system may drop below a predetermined voltage level during operation of the electrical circuit, according to the present invention. The chip power image and information regarding the chip technology that is required are illustrated by blocks 200 and 202. The chip power image provides detailed information about averaged RLC-parameters, formed by the non-inductive resistance, the capacity reactance and the inductance. Information regarding the chip technology includes details about the size of the structure; the semiconductor material used, including its physical characteristics; and the semiconductor fabrication technology, e.g., CMOS. The information concerning the chip power image and the chip technology allow to calculate the averaged propagation speed v of the on-chip power distribution network, as illustrated by block 204. The typical technology dependent switching transition time $T_S$ is also known. Taking these parameters, the critical decoupling capacitance distance D can be calculated using formula (2) shown above, as illustrated by block 206. Hence, the determined length is derived from the propagation speed on the power supply network and the transition time of the electrical elements. Advantageously, the length is calculated by the product of the propagation speed and the transition time divided by four.

Next, the chip area is split into independent analysis partitions of maximum size D by D, and the partial switching and non-switching capacitance values within each analysis partition is summarized. Generally, dividing the chip or circuit area into a plurality of partitions of specified size is performed by dividing it into equally formed and sized portions that cover basically the entire circuit area, e.g., triangles, squares or even hexagonally formed areas. In a preferred embodiment of the present invention, specifying the size of a portion of the chip area is performed by taking the determined length as the length of the edge of a square. Before summarizing the switching capacitance $C_S$ and the non-switching capacitance $C_0$ individually for each partition, each switching and non-switching capacitance $C_S$ and $C_0$ is assigned to exactly one particular partition of the chip area. After summarizing the partial switching and non-switching capacitance values within each analysis partition the worst case power voltage collapse can be calculated according to formula (1), as represented by block 208. Calculating the voltage level drop $\Delta U$ individually for each partition takes into consideration the sum of the switching capacitance $C_S$ and the sum of the non-switching capacitance $C_0$, as previously determined for the particular partition.

More precisely, the calculation of the voltage level drop $\Delta U$ is performed by dividing the determined switching capacitance $C_S$ of the partition by the summation of the determined switching capacitance $C_S$ and non-switching capacitance $C_0$ of the partition and multiplying the quotient with the specified supply voltage level $U_0$ as shown in formula (1).

Finally, as illustrated by block 210, a two-dimensional numerical matrix of worst case power voltage changes $\Delta U$ is calculated and displayed in relation to the respective portion. Furthermore, displaying the calculated voltage level drop $\Delta U$ includes the step of creating a two-dimensional illustration representing the circuit area indicating the calculated voltage level drop $\Delta U$ in accordance with the values determined for each partition. The two-dimensional illustration is preferably divided in the same way as the circuit or chip area.

The collapse matrix depends on how the functional units are built, where they are placed on the chip and how the worst case functional switching event is distributed. Because of the efficient processing scheme, the calculation of the power collapse matrix can be performed during chip placement and, thus, act as guide to the power noise optimization in order to guarantee a balanced design.

If the analysis exhibits too high collapse values, either additional power supply decoupling capacitors can be placed into the critical areas or the switching density has to be reduced by spreading out the affected circuits into a larger area. This analysis feedback loop provides a method for reducing the on-chip voltage noise.

Figure 3:
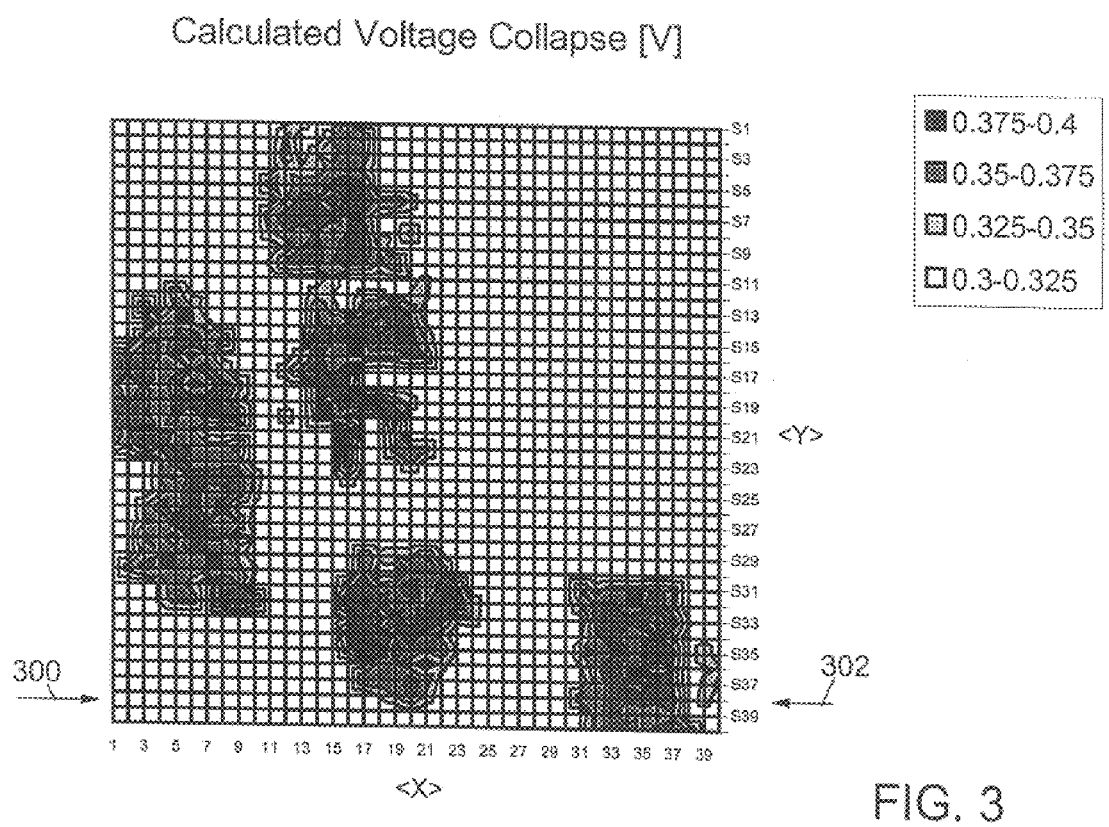
FIG. 3 shows a two-dimensional illustration representing the circuit area indicating a calculated voltage level drop ($\Delta U$) in accordance with the values determined for each portion of the circuit area, according to the present invention.

Referring now to FIG. 3, there is depicted a two-dimensional illustration representing the circuit area indicating a calculated voltage level drop $\Delta U$ in accordance with the values determined for each partition of the circuit area, according to the present invention. Particularly, the example shows a graphical representation of a worst case power collapse matrix, calculated according to the methodology of the invention. However, for sake of clarity, the grid is not so finely drawn as the actual measurements. Furthermore, only certain ranges of the calculated voltage level drop $\Delta U$ are marked by a different pattern. It is acknowledged that an actual representation contains more details and the two-dimensional representation of the results is preferably depicted by using different colors which represent specific ranges of voltage level drop, e.g., the portion of the illustration having a calculated voltage level drop in the range from 0.3 to 0.325 volts could be colored green.

Figure 4:
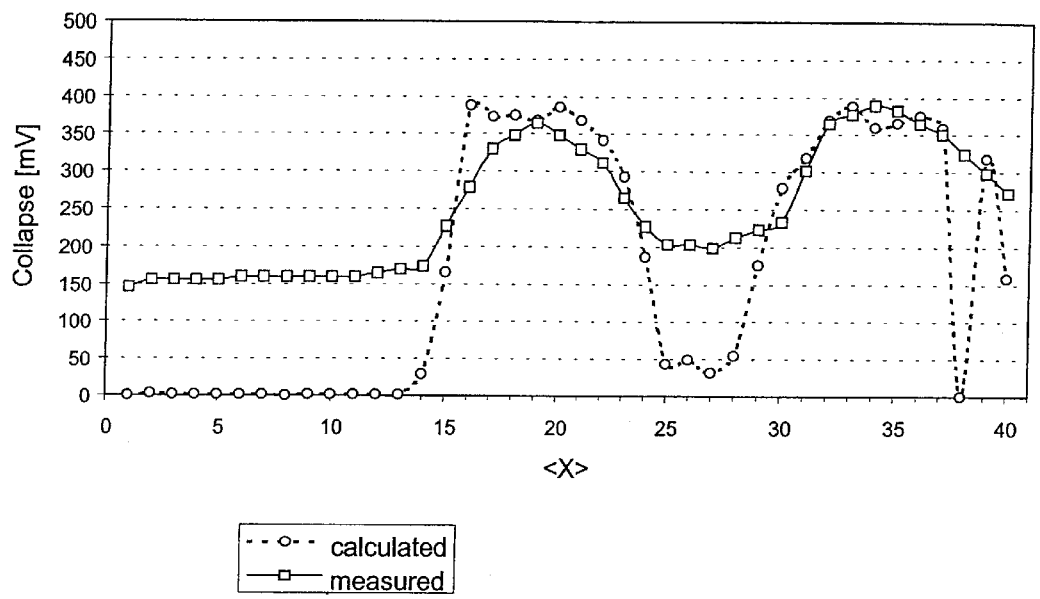
FIG. 4 is a chart depicting a horizontal scan of the two-dimensional illustration of FIG. 3.

FIG. 4 shows a chart depicting a horizontal scan of the two-dimensional illustration of FIG. 3. Actually, the measured on-chip power voltage collapse values and the calculated values along the line in FIG. 3 indicated by the arrows 300 and 302 are shown. Deviations are obvious for chip areas without switching activity. The collapse measured therein is propagated from areas with high switching activity and are, therefore, not related to the calculation scheme. However, the most critical areas having a significant voltage level drop are calculated with a minimum of variation from the actually measured values.

Whereas the present invention has been described in terms of preferred embodiments, those skilled in the art will recognize that the invention can be practiced with changes and modifications, all of which fall within the spirit and scope of the appended claims.

What is claimed is:

1. A method for analyzing the dynamic behavior of an electrical circuit having a plurality of electrical elements which are powered by a power supply providing a voltage level ($U_0$) to each of said electrical elements, the analysis determining when the voltage level at any of the electrical elements drops below a predetermined voltage level when a number of the electrical elements switch simultaneously, the method comprising the steps of:

determining a length for specifying the size of a portion of a circuit area on which the electrical circuit is formed;

dividing said circuit area into a plurality of portions having the specified size;

summarizing the switching capacitance ($C_s$) and the non-switching capacitance ($C_0$) individually for each of said portions; and calculating the voltage level drop ($\Delta U$) individually for each of said portions.

2. The method according to claim 1, wherein the step of determining a length for specifying the size of a portion of a circuit area derives the determined length from the propagation speed (v) on the power supply network and the transition time ($T_s$) of one said electrical elements.

3. The method according to claim 2, wherein said length is calculated as one-fourth the product of said propagation speed and said transition time.

4. The method according to claim 1, wherein specifying the size of said portion is performed by taking the determined length as the length of the edge of a square.

5. The method according to claim 1, wherein the step of dividing said circuit area into a plurality of portions of the specified size is performed by dividing it into equally formed and sized portions, substantially covering the circuit area.

6. The method according to claim 1, wherein the step of separately summarizing the switching capacitance ($C_s$) and the non-switching capacitance ($C_0$) individually for each portion includes the step of assigning each switching and non-switching capacitance ($C_s$, $C_0$) to exactly one particular portion.

7. The method according to claim 1, wherein the step of calculating the voltage level drop ($\Delta U$) individually for each portion factors in the sum of the switching capacitance ($C_s$) and of the non-switching capacitance ($C_0$) determined for the particular portion.

8. The method according to claim 7, wherein the step of calculating the voltage level drop ($\Delta U$) is performed by dividing the determined switching capacitance ($C_s$) of the portion by the summation of the determined switching capacitance ($C_s$) and non-switching capacitance ($C_0$) of the portion and multiplying the quotient with said specified supply voltage level ($U_0$).

9. The method according to claim 1, further comprising the step of obtaining from a chip design data set the value of the switching and non-switching capacitance ($C_s$, $C_0$).

10. The method according to claim 1, further comprising the step of displaying the calculated voltage level drop ($\Delta U$) in relation to the respective portion.

11. The method according to claim 10, wherein the step of displaying the calculated voltage level drop ($\Delta U$) includes the step of creating a two-dimensional illustration representing the circuit area indicating the calculated voltage level drop ($\Delta U$) in accordance with the values determined for each of said portions.

12. The method according to claim 11, wherein the step of creating a two-dimensional illustration further comprises the step of dividing the two-dimensional illustration in the same manner as the circuit area.

13. A system for analyzing the dynamic behavior of an electrical circuit having a plurality of electrical elements being powered by a power supply system providing a specified supply voltage level ($U_0$) to each of said electrical elements, said analysis resulting in a representation of whether the supply voltage level ($U_0$) at any of said electrical elements may drop below a predetermined voltage level under the condition that a predetermined number of said electrical elements are driven at the same instant of time, the system comprising:

means for determining a length for specifying the size of a portion of a circuit area on which the electrical circuit is formed;

means for dividing said circuit area into a plurality of portions of the specified size;

means for separately summarizing the switching capacitance ($C_s$) and the non-switching capacitance ($C_0$) individually for each portion; and means for calculating the voltage level drop ($\Delta U$) individually for each of said portions.

14. A program storage device readable by machine, tangibly embodying a program of instructions executable by the machine to perform method steps for analyzing the dynamic behavior of an electrical circuit having a plurality of electrical elements which are powered by a power supply providing a voltage level ($U_0$) to each of said electrical elements, the analysis determining when the voltage level at any of the electrical elements drops below a predetermined voltage level when a number of the electrical elements switch simultaneously, the method comprising the steps of:

determining a length for specifying the size of a portion of a circuit area on which the electrical circuit is formed;

dividing said circuit area into a plurality of portions having the specified size;

summarizing the switching capacitance ($C_s$) and the non-switching capacitance ($C_0$) individually for each of said portions; and calculating the voltage level drop ($\Delta U$) individually for each of said portions.

* * * * *